US012701989B2

(12) United States Patent
Hwang et al.

(10) Patent No.: US 12,701,989 B2
(45) Date of Patent: Aug. 4, 2026

(54) TANTALUM DOPED RUTHENIUM LAYERS FOR INTERCONNECTS

(71) Applicant: Applied Materials, Inc., Santa Clara, CA (US)

(72) Inventors: Shinjae Hwang, Santa Clara, CA (US); Feng Chen, San Jose, CA (US); Muthukumar Kaliappan, Fremont, CA (US); Michael Haverty, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 427 days.

(21) Appl. No.: 18/236,562

(22) Filed: Aug. 22, 2023

(65) Prior Publication Data

US 2024/0071927 A1     Feb. 29, 2024

Related U.S. Application Data

(60) Provisional application No. 63/400,768, filed on Aug. 25, 2022.

(51) Int. Cl.
*H10W 20/00*          (2026.01)
*C23C 16/455*          (2006.01)
(Continued)

(52) U.S. Cl.
CPC ... *H10W 20/4403* (2026.01); *C23C 16/45525* (2013.01); *H10W 20/057* (2026.01);
(Continued)

(58) Field of Classification Search
CPC ............. H10W 72/351; H10W 72/325; H10W 72/01338; H10W 20/057; H10W 20/4403; C23C 16/45525
See application file for complete search history.

(56) References Cited

U.S. PATENT DOCUMENTS

| | | |
|---|---|---|
| 11,410,881 B2 | 8/2022 | Li et al. |
| 2008/0142971 A1 | 6/2008 | Dordi et al. |

(Continued)

FOREIGN PATENT DOCUMENTS

| | | |
|---|---|---|
| KR | 20090045677 A | 5/2009 |
| KR | 20190021184 A | 3/2019 |
| TW | 201907038 A | 2/2019 |

OTHER PUBLICATIONS

PCT International Search Report and Written Opinion in PCT/US2021/039332 dated Oct. 21, 2021, 9 pages.
(Continued)

*Primary Examiner* — Kretelia Graham
*Assistant Examiner* — Nkechinyere Esiaba
(74) *Attorney, Agent, or Firm* — SERVILLA WHITNEY LLC

(57)          ABSTRACT

Methods of forming interconnects and electronic devices are described. Methods of forming interconnects include forming a tantalum nitride layer on a substrate; forming a ruthenium layer on the tantalum nitride layer; and exposing the tantalum nitride layer and ruthenium layer to a plasma comprising a mixture of hydrogen ($H_2$) and argon (Ar) to form a tantalum doped ruthenium layer thereon. Apparatuses for performing the methods are also described.

18 Claims, 5 Drawing Sheets

<u>100</u>

(51) Int. Cl.
  *H10W 20/44*        (2026.01)
  *H10W 72/00*        (2026.01)
  *H10W 72/30*        (2026.01)

(52) U.S. Cl.
  CPC .... *H10W 72/01338* (2026.01); *H10W 72/325*
        (2026.01); *H10W 72/351* (2026.01)

(56)            References Cited

U.S. PATENT DOCUMENTS

| | | |
|---|---|---|
| 2008/0179747 A1 | 7/2008 | Sakai et al. |
| 2010/0311237 A1 | 12/2010 | Seutter et al. |
| 2011/0306203 A1 | 12/2011 | Dordi et al. |
| 2013/0140698 A1 | 6/2013 | Lakshmanan et al. |
| 2019/0385908 A1 | 12/2019 | Xie et al. |
| 2021/0351072 A1* | 11/2021 | Chen ................... H10W 20/048 |
| 2021/0391275 A1 | 12/2021 | Kuo et al. |
| 2021/0407853 A1 | 12/2021 | Li et al. |
| 2022/0328348 A1 | 10/2022 | Li et al. |
| 2023/0070489 A1 | 3/2023 | Haverty et al. |

OTHER PUBLICATIONS

Machine Translation of KR20090045677A, 12 pages.
PCT International Search Report and Written Opinion in PCT/
US2023/030768 mailed Dec. 12, 2023, 9 pages.

* cited by examiner

<u>100</u>

<u>120</u>

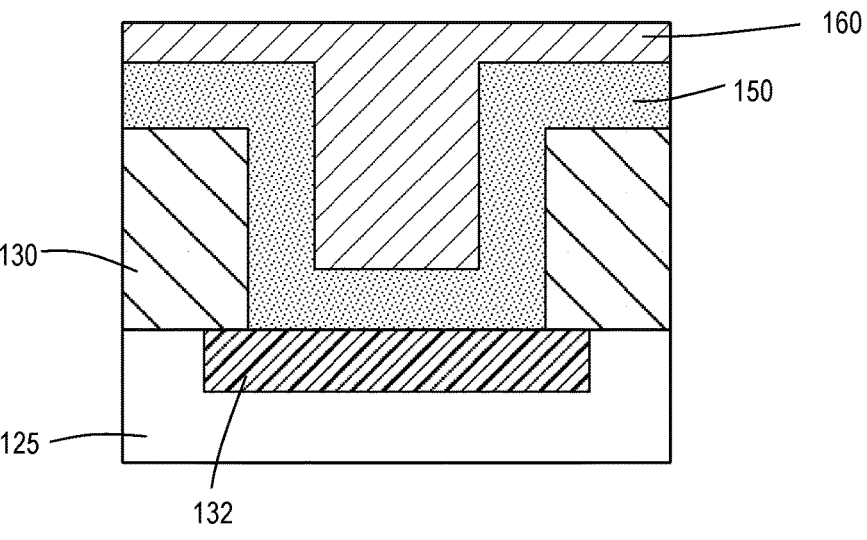
FIG. 3D
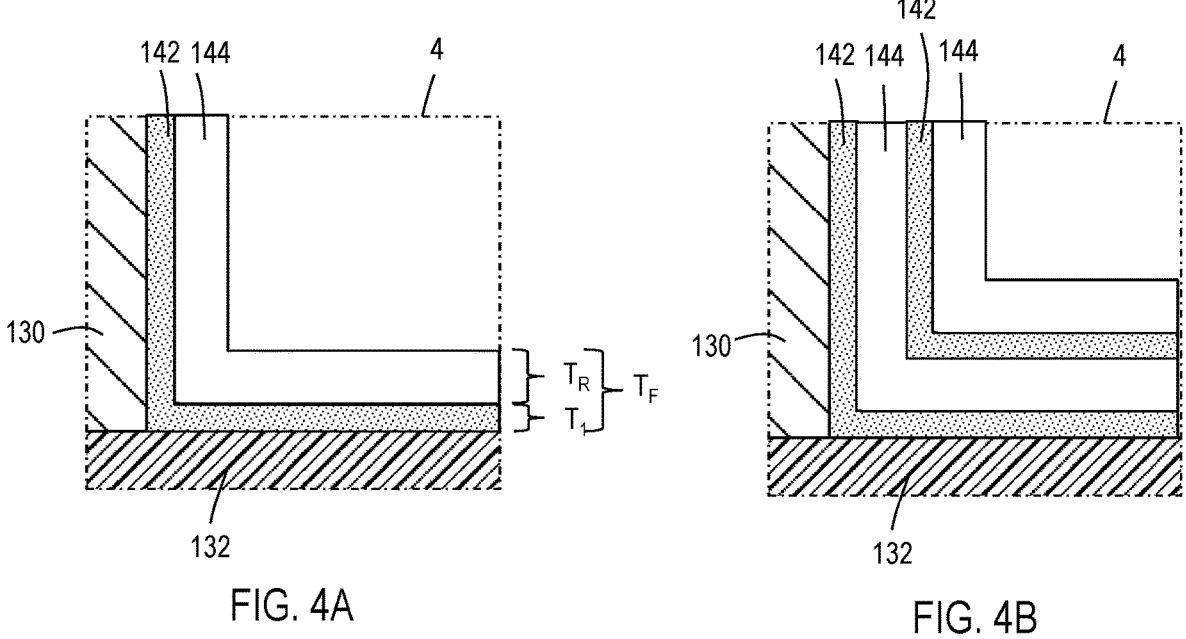
FIG. 4A
FIG. 4B

TANTALUM DOPED RUTHENIUM LAYERS FOR INTERCONNECTS

CROSS-REFERENCE TO RELATED APPLICATIONS

This application claims priority to U.S. Provisional Application No. 63/400,768, filed Aug. 25, 2022, the entire disclosure of which is hereby incorporated by reference herein.

TECHNICAL FIELD

Embodiments of the disclosure generally relate to methods of forming barrier layers. In particular, embodiments of the disclosure relate to methods of forming tantalum doped ruthenium layers for interconnects.

BACKGROUND

The miniaturization of semiconductor circuit elements has reached a point where feature sizes of 20 nm and less are fabricated on a commercial scale. As the critical dimensions continue to decrease in size, new challenges arise for process steps like filling a gap between circuit elements. As the width between the elements continues to shrink, the gap between them often gets taller and narrower, making the gap more difficult to fill and contacts more difficult to make robust.

Ruthenium doped tantalum nitride is being studied as a copper barrier material for smaller node applications. However, integrating ruthenium doped tantalum nitride into small features can result in copper/ruthenium corrosion due to, for example, electromigration of the copper immediately adjacent the ruthenium, breaking the connection.

Ruthenium (Ru) doped tantalum nitride (TaN) often contains high carbon (C) concentrations and is not efficiently or easily removed by in-situ $H_2/Ar$ plasma during atomic layer deposition (ALD) tantalum nitride formation. Studies on tantalum doped ruthenium layers show a copper (Cu) diffusion activation energy greater than a copper (Cu) diffusion activation energy of ruthenium doped tantalum layers.

Accordingly, there is a need for methods of forming tantalum doped ruthenium layers for interconnects.

SUMMARY

One or more embodiments of the disclosure are directed to methods of forming interconnects. The methods include forming a tantalum nitride layer on a substrate; forming a ruthenium layer on the tantalum nitride layer; and exposing the tantalum nitride layer and ruthenium layer to a plasma comprising a mixture of hydrogen ($H_2$) and argon (Ar) to form a tantalum doped ruthenium layer thereon.

Additional embodiments of the disclosure are directed to other methods of forming interconnects. In some embodiments, a method of forming an interconnect comprises forming at least one conformal tantalum nitride layer and at least one ruthenium layer on a substrate having a surface with a structure formed therein. The structure extends a distance into the substrate and has sidewalls and a bottom. The bottom comprises a conductive material and the sidewalls comprise a low-k dielectric material comprising one or more of fluorine-doped silicon oxide, organosilicate glass or porous silicon dioxide. The at least one ruthenium layer is formed on the at least one conformal tantalum nitride layer. In some embodiments, the method of forming the interconnect further comprises exposing the conformal tantalum nitride layer and ruthenium layer to a plasma comprising a mixture of hydrogen ($H_2$) and argon (Ar) to form a tantalum doped ruthenium layer comprising greater than or equal to 80 at. % ruthenium.

Further embodiments of the disclosure are directed to electronic devices. The electronic devices described herein include a substrate having a surface with a structure formed therein. The structure extends a distance into the substrate and has sidewalls and a bottom. The bottom comprises a conductive material and the sidewalls comprise a dielectric material. The electronic devices further include a tantalum doped ruthenium layer in the structure. The tantalum doped ruthenium layer comprises greater than or equal to 80 at. % ruthenium. The electronic devices further comprise a metal fill in the structure on the tantalum doped ruthenium layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A through 3D illustrate a schematic representation of an electronic device during execution of the method of FIG. 2;

FIGS. 4A and 4B illustrate an expanded view of region 4 of FIG. 3B according to one or more embodiment of the disclosure;

DETAILED DESCRIPTION

Figure 1:
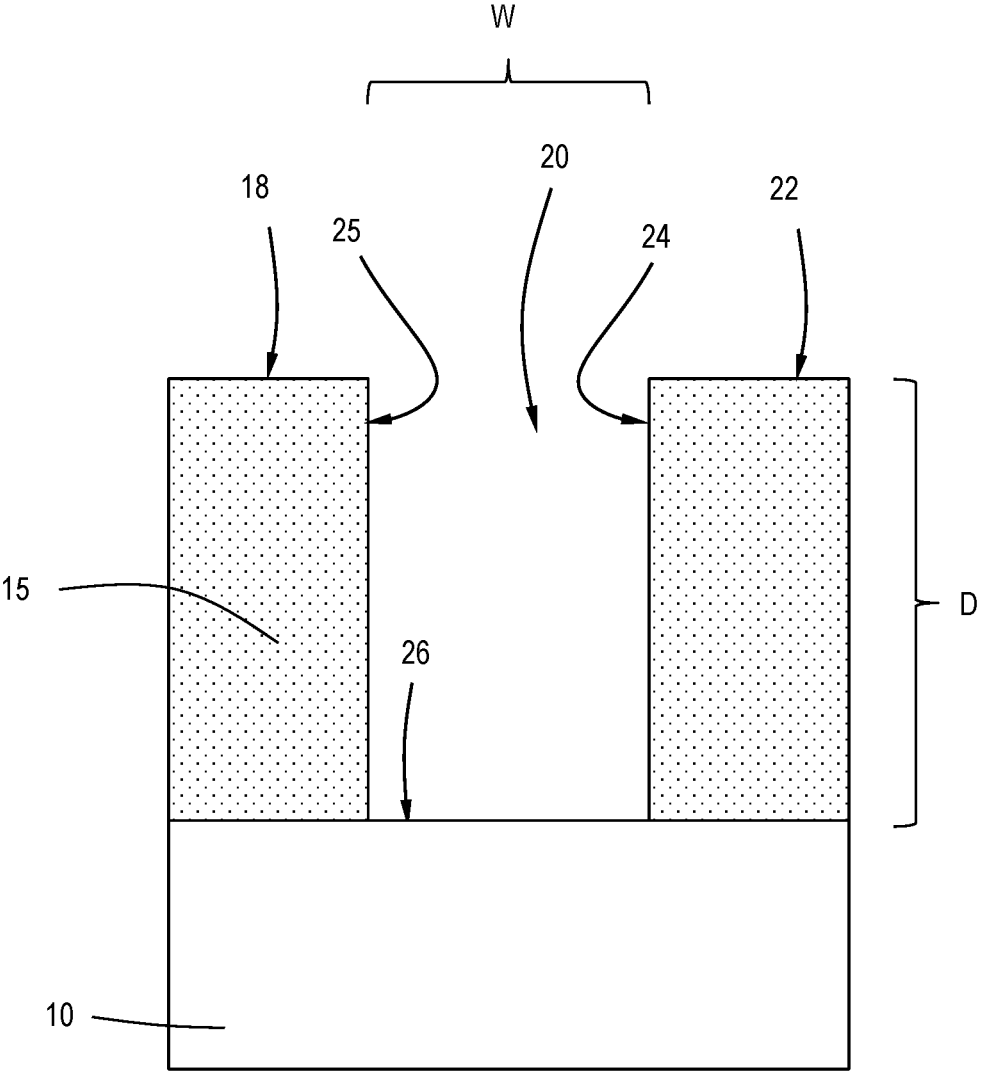
FIG. 1 shows a schematic representation of a substrate in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with a bottom. In some embodiments, the bottom of a via comprises an open bottom defined or bounded by underlying material, for example, dielectric material, which may also define the two sidewalls, or the underlying material at the bottom may be a conductor such as a metal (e.g., copper), which can be the same as or different from the sidewall material.

The term "on" indicates that there is direct contact between elements. The term "directly on" indicates that there is direct contact between elements with no intervening elements.

Embodiments of the present disclosure advantageously provide tantalum doped ruthenium layers that perform as a better copper (Cu) barrier for an advanced node that can be utilized for a more challenging structure as a combined barrier-liner in the logic devices. In the advanced copper (Cu) interconnect, scaling down the copper (Cu) barrier thickness has been gaining attention since it requires accommodating a smaller structure. However, intrinsic barrier properties, related to the activation energy for copper (Cu) diffusion, limit the thickness that a layer can act as an effective barrier. Embodiments of the present disclosure demonstrate that doping of Ta into Ru can increase activation energy for copper (Cu) diffusion greater than 3.0 eV, or greater than 4.0 eV at a distance of 15 Å from a surface of the tantalum doped ruthenium layer compared to tantalum nitride (TaN) barrier layers.

While not wishing to be bound by theory, it is thought that previously disclosed barrier or liner layers, such as tantalum nitride, a total thickness of greater than or equal to 25 Å total thickness to perform as an effective copper (Cu) barrier/liner. Embodiments of the present disclosure demonstrate that tantalum doped ruthenium layers exhibit improved intrinsic barrier properties in the bulk structure and expect to scale down the barrier thickness less than or equal to 20 Å, allowing access to improved copper (Cu) interconnect structures.

Embodiments of the present disclosure demonstrate a tantalum doped ruthenium layer comprising about 20 at. % tantalum can increase activation energy for copper (Cu) diffusion greater than or equal to 1 eV compared to a copper (Cu) diffusion activation energy of a 20% ruthenium doped tantalum layer at a distance of 15 Å from a surface of the tantalum doped ruthenium layer.

The embodiments of the disclosure are described by way of the Figures, which illustrate electronic devices and processes for forming interconnects in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a structure used in accordance with one or more embodiments. The substrate 10 illustrated in FIG. 1 includes a material 15 (e.g., a dielectric) with a structure 20 formed in the surface 18 thereof. The structure 20 has a top 22, bottom 26 and sides 24, 25. In the illustrated embodiment, the structure 20 is bounded on the bottom 26 and sides 24, 25 by the material 15. In some embodiments, the bottom 26 of the structure 20 is bounded by a different material (not shown) than the sides 24, 25. For example, the bottom 26 of the structure in some embodiments comprises a conductive material and the sides 24, 25 comprise a dielectric. In some embodiments, the bottom 26 of the structure 20 comprises a dielectric and the sides 24, 25 comprise a conductive material. In some embodiments, the bottom and sides are different materials and both bottom and sides are a dielectric or a conductive material.

The width W of the structure 20 is defined as the distance between the sides 24, 25. The skilled artisan will recognize that the structure illustrated is exemplary and that a typical structure may not have squared corners. The width of such a structure is measured as the average distance between the sidewalls measured parallel to the surface of the structure. The depth D of the structure is defined as the distance from the top 22 to the bottom 26 of the structure 20. The aspect ratio of the structure 20 is defined as the depth D:width W of the structure. In some embodiments, the aspect ratio is greater than or equal to 5:1, 10:1, 15:1, 20:1 or 25:1.

In some embodiments, the material 15 comprises a dielectric. Suitable dielectrics include, but are not limited to, silicon oxide (SiO), silicon dioxide ($SiO_2$), silicon nitride (SiN), silicon oxynitride (SiON), aluminum nitride (AlN), aluminum oxide (AlO) or a high-k dielectric material. In some embodiments, the material comprises a hardmask material (e.g., carbon (C)). As used in this specification and the appended claims, unless otherwise specified by subscripts, chemical formulae are representative of the elemental identity and are not intended to imply any particular stoichiometric ratios. For example, a titanium nitride (TiN) film can have any suitable combination of titanium and nitrogen atoms and are not limited to a unity relationship.

Some embodiments of the method comprise independently forming a tantalum nitride layer and a ruthenium layer by atomic layer deposition (ALD) or chemical vapor deposition (CVD) processes. One or more embodiments of the methods comprise sequentially forming a tantalum nitride layer and a ruthenium layer by atomic layer deposition (ALD) or chemical vapor deposition (CVD) processes.

In some embodiments, a physical vapor deposition (PVD) treatment with high density plasma and bias-able pedestal further improves one or more of barrier performance, carbon and/or ruthenium content without damaging a low-k dielectric.

Figure 2:
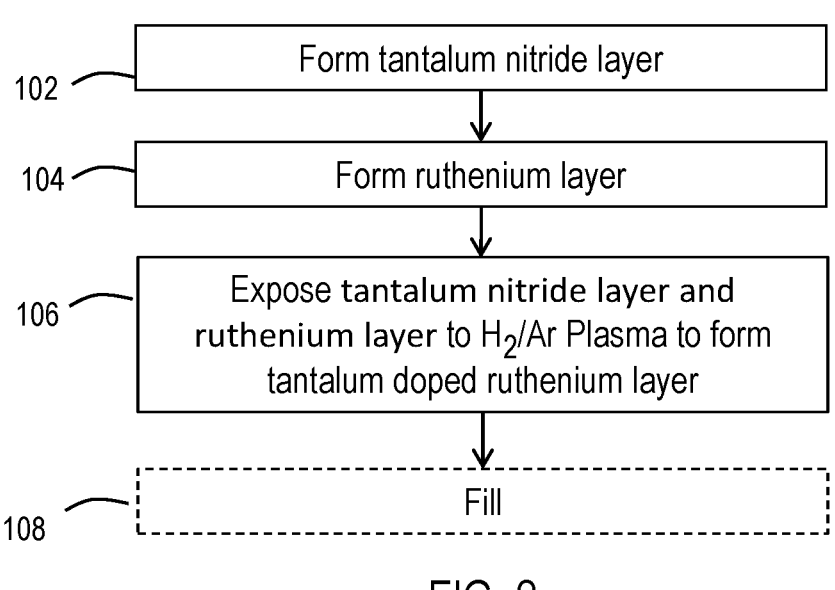
FIG. 2 illustrates a flowchart of a method in accordance with one or more embodiments of the disclosure.

FIG. 2 illustrates an embodiment of a method 100 of forming an interconnect (e.g., a copper interconnect) according to one or more embodiment of the disclosure. FIGS. 3A through 3D illustrate an electronic device 120 being processed using the method 100 of FIG. 2. The skilled artisan will recognize that the illustrated embodiments are merely exemplary embodiments, and the disclosure is not limited to the illustrated process and/or illustrated embodiments.

The method 100 includes forming a tantalum nitride layer on a substrate (operation 102); forming a ruthenium layer on the tantalum nitride layer (operation 104); and exposing the tantalum nitride layer and ruthenium layer to a plasma comprising a mixture of hydrogen ($H_2$) and argon (Ar) to form a tantalum doped ruthenium layer thereon (operation 106). In some embodiments, where the substrate includes a surface with structure formed therein, the method 100 optionally includes filling the structure with a metal fill material (operation 108).

Figure 3A:
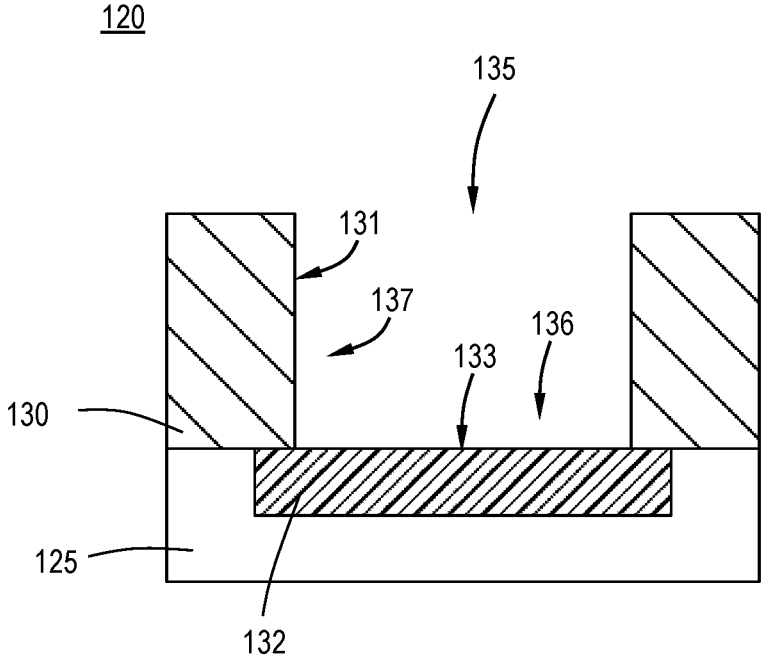

FIG. 3A illustrates a substrate 125 with a first material 130 and a second material 132 forming a structure 135. The structure 135 illustrated is bound on the sidewalls 137 by the surface 131 of the first material 130 and on the bottom 136 by the top surface 133 of the second material 132. In some embodiments, as shown in FIG. 3A, the structure 135 in the first material 130 has a bottom 136 and at least one sidewall 137. In some embodiments, the structure 135 is a circular via with one cylindrical sidewall 137. In some embodiments, the structure 135 is a trench with two or more sidewalls 137.

Figure 3B:
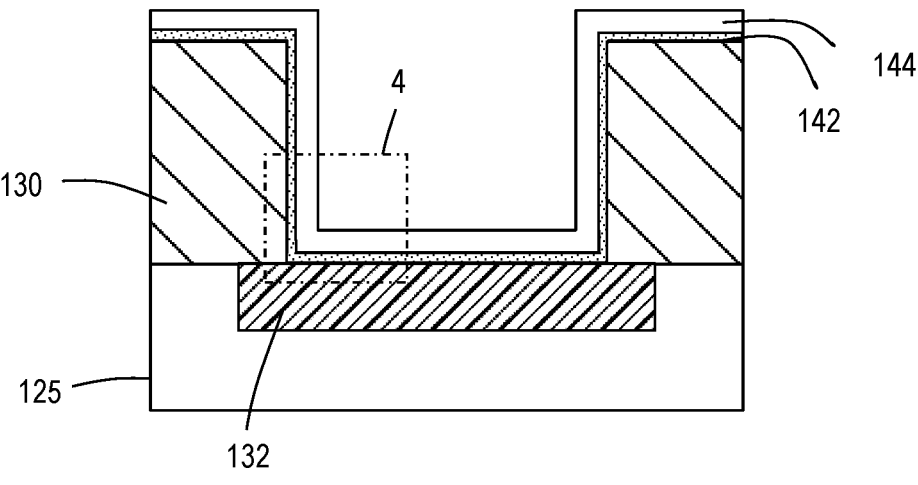
Figure 3C:
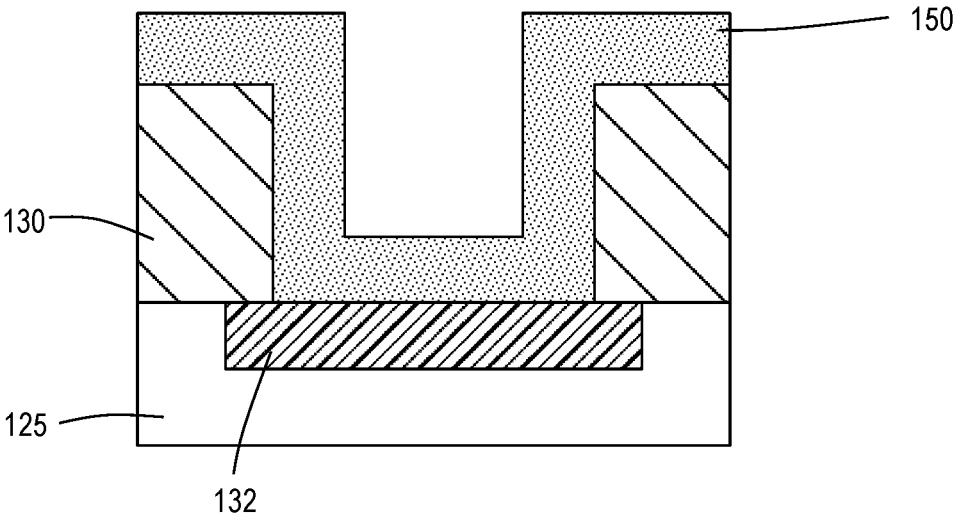

The substrate 125, and any layer formed thereon, is exposed to one or more operations of method 100 to form a tantalum doped ruthenium layer 150, as shown in FIG. 3C. The disclosure describes the Figures and refers to a tantalum doped ruthenium layer 150. FIGS. 4A and 4B illustrated an expanded view of region 4 in FIG. 3B in accordance with one or more embodiment of the disclosure.

The first material 130 can be any suitable material or combination of materials. In some embodiments, the first material 130 comprises a dielectric. Suitable dielectrics include, but are not limited to, silicon oxide, silicon nitride, silicon oxynitride, low-k dielectrics (e.g., porous or carbon-doped $SiO_x$ with k value less than about 5). In some embodiments, the low-k dielectric comprises one or more of fluorine-doped silicon oxide, organosilicate glass or porous silicon dioxide. In other embodiments, the dielectric layer is a multilayer structure. For example, in one or more embodiments, the dielectric layer comprises a stack of oxide and nitride layers.

The second material 132 can be any suitable material or combination of materials. In some embodiments, the second material 132 comprises a conductive material. Suitable conductive materials include, but are not limited to, copper (Cu) or tungsten (W). In some embodiments, the FIG. 3B illustrates a tantalum nitride (TaN) layer 142 formed on the first material 130. In some embodiments, the tantalum nitride layer 142 is a conformal layer. As used in this manner, a "conformal layer" has a thickness that does not vary by more than 0.5%, 1%, 5%, 10% or 15% relative to the average thickness. In some embodiments, the tantalum nitride layer 142 has a ruthenium (Ru) layer 144 deposited/formed thereon. In one or more embodiments, the ruthenium layer 144 is a conformal layer.

In some embodiments, the tantalum nitride layer 142 has a thickness in a range of from 1 Å to 5 Å, or in the range of 2 Å to 4 Å. In some embodiments, the ruthenium layer 144 has a thickness in a range of from 6 Å to 35 Å, or in the range of 8 Å to 25 Å, or in the range of 10 Å to 20 Å.

In some embodiments, the tantalum nitride layer 142 and the ruthenium layer 144 comprise a lamination of multiple layers. In the embodiment illustrated in FIGS. 2, 3B and 4B, the tantalum nitride layer 142 and ruthenium layer 144 are part of a lamination of alternating tantalum nitride layers and ruthenium layers. In some embodiments, forming the doped tantalum nitride layer comprises forming a lamination of tantalum nitride and ruthenium layers by atomic layer deposition (ALD).

In some embodiments, the tantalum nitride layer 142 is formed to a first layer thickness $T_1$ (as shown in FIG. 4A) by any suitable deposition technique. In an exemplary embodiment, the tantalum nitride layer 142 is formed by atomic layer deposition (ALD) to a first layer thickness in the range of 1 Å to 5 Å. In some embodiments, the first layer thickness is about 3 Å.

The atomic layer deposition of tantalum nitride (TaN) in some embodiments comprises sequential exposures of a tantalum precursor and a nitrogen reactant. The tantalum precursor can be any suitable tantalum species including, but not limited to, pentakis(dimethylamino)tantalum (PDMAT) and the nitrogen reactant comprises ammonia ($NH_3$). The skilled artisan will recognize that reactions with PDMAT and $NH_3$ are merely representative of one possible ALD reaction and should not be taken as limiting the scope of the disclosure.

The temperature during the formation of the tantalum nitride layer 142 and/or the ruthenium layer 144 can be any suitable temperature depending on, for example, the reactive species being used. In some embodiments, the substrate is maintained at a temperature in a range of from 150° C. to 350° C., including in a range of from 175° C. to 325° C., or in a range of from 200° C. to 300° C., or in a range of from 225° C. to 275° C.

The pressure during the formation of the tantalum nitride layer 142 and/or the ruthenium layer 144 can be any suitable pressure depending on, for example, the reactive species being used. In some embodiments, the substrate is maintained at a pressure in a range of from 0.5 Torr to 30 Torr, including in a range of from 1 Torr to 25 Torr, or in a range of from 5 Torr to 20 Torr, or in a range of from 10 Torr to 15 Torr.

In some embodiments, the ruthenium layer 144 formed by operation 104 comprises metallic ruthenium. In some embodiments, the ruthenium layer 144 consists essentially of metallic ruthenium. As used in this manner, the term "consists essentially of" means that the specified layer (e.g., ruthenium layer 144) is made up of greater than or equal to 95%, 98%, 99% or 99.5% of the stated species (e.g., ruthenium) on an atomic basis.

In some embodiments, the ruthenium layer 144 has a thickness $T_R$ (see FIG. 5A) in a range of from of from 6 Å to 35 Å, including in a range of from 6 Å to 30 Å, or in a range of from 6 Å to 25 Å, or in a range of from 6 Å to 20 Å, or in a range of from 6 Å to 15 Å, or in a range of from 10 Å to 15 Å.

In some embodiments, the ruthenium layer 144 is amorphous. In some embodiments, the ruthenium layer 144 is substantially amorphous. As used in this manner, the term "substantially amorphous" means that greater than 90%, 95% or 98% of the volume of the ruthenium layer 144 is amorphous. In some embodiments, the ruthenium layer 144 has a nanocrystallite structure.

In some embodiments, the ruthenium layer 144 is formed while the substrate is maintained at the same process temperature as during formation of the tantalum nitride layer 142.

In some embodiments, the total thickness $T_F$ (see FIG. 5A) of the tantalum nitride layer 142 and ruthenium layer 144 is in a range of from 7 Å to 40 Å, including in a range of from 7 Å to 35 Å, or in a range of from 7 Å to 30 Å, or in a range of from 7 Å to 25 Å, or in a range of from 7 Å to 20 Å, or in a range of from 7 Å to 15 Å, or in a range of from 10 Å to 15 Å.

In some embodiments, as shown in FIG. 4B, the tantalum nitride layer 142 and the ruthenium layer 144 maintain a laminate structural appearance. While the illustrated embodiment of FIG. 4B shows a laminate structural appearance of a single pair including two tantalum nitride layers 142 and two ruthenium layers 144, the laminate structural appearance is not limited to a single pair two tantalum nitride layers 142 and two ruthenium layers 144. The adjoining edges of the individual layers may blur together while keeping the laminate structural appearance.

With reference to FIG. 3C, exposing the tantalum nitride layer 142 and the ruthenium layer 144 to a plasma comprising a mixture of hydrogen ($H_2$) and argon (Ar) at operation 106 results in a tantalum doped ruthenium layer 150. As used herein, exposing the tantalum nitride layer 142 and the ruthenium layer 144 to a plasma comprising a mixture of hydrogen ($H_2$) and argon (Ar) at operation 106 resulting in a tantalum doped ruthenium layer 150 may be referred to as "the plasma exposure process 106."

Embodiments of the present disclosure advantageously provide tantalum doped ruthenium layers (e.g., tantalum doped ruthenium layer 150) having a copper (Cu) diffusion activation energy greater than a copper diffusion activation energy of a 20% ruthenium doped tantalum layer.

Further embodiments of the present disclosure advantageously provide tantalum doped ruthenium layers (e.g., tantalum doped ruthenium layer 150) having a copper (Cu) diffusion activation energy greater than 4.0 eV at a distance of 15 Å from a surface of the tantalum doped ruthenium layer.

The thickness of the individual layers may be affected by the plasma exposure to different degrees. In some embodiments, the plasma exposure process 106 does not change, or does not substantially change the thickness of the other layers (e.g., the tantalum nitride layer 142 and the ruthenium layer 144). As used in this manner, the thickness is not substantially changed if the thickness changes by less than ±5% of the pre-plasma thickness.

In some embodiments, the thickness of the tantalum doped ruthenium layer 150 is equal to the total thickness $T_F$ (see FIG. 5A) of the tantalum nitride layer 142 and ruthenium layer 144. In some embodiments, the thickness of the tantalum doped ruthenium layer 150 is in a range of from 7 Å to 40 Å, including in a range of from 7 Å to 35 Å, or in a range of from 7 Å to 30 Å, or in a range of from 7 Å to 25 Å, or in a range of from 7 Å to 20 Å, or in a range of from 7 Å to 15 Å, or in a range of from 10 Å to 15 Å.

In some embodiments, the concentration of dopant (e.g., tantalum) in the tantalum doped ruthenium layer 150 is in a range of from 3 at. % to 70 at. % tantalum, including in a range of from 5 at. % to 65 at. % tantalum, or in a range of from 10 at. % to 60 at. % tantalum, or in a range of from 15 at. % to 55 at. % tantalum, or in a range of from 20 at. % to 50 at. % tantalum, or in a range of from 25 at. % to 45 at. % tantalum, or in a range of from 30 at. % to 40 at. % tantalum.

In some embodiments, the tantalum doped ruthenium layer 150 is a conformal film formed on the sidewalls 137 and bottom 136 of the structure 135.

Referring again to method 100 of FIG. 2, in some embodiments a metal film 160 is deposited on the tantalum doped ruthenium layer 150 at operation 108 to fill the structure, as shown in FIG. 3D. In some embodiments, the metal film 160 is a metal contact. In some embodiments, the metal film 160 comprises or consists essentially of one or more of copper (Cu), cobalt (Co), tungsten (W), or copper doped with one or more of manganese (Mn), tungsten (W) or aluminum (Al).

The metal film 160 can be deposited by any suitable technique known to the skilled artisan. In some embodiments, the metal film 160 is deposited by atomic layer deposition (ALD), chemical vapor deposition (CVD), or physical vapor deposition (PVD).

Various hardware arrangements can be used to implement the method 100. In some embodiments, forming the tantalum nitride layer, forming the ruthenium layer, exposing the tantalum nitride layer and ruthenium layer to a plasma comprising a mixture of hydrogen ($H_2$) and argon (Ar) to form a tantalum doped ruthenium layer occur in the same process chamber. In some embodiments, forming the tantalum nitride layer, forming the ruthenium layer, exposing the tantalum nitride layer and ruthenium layer to a plasma comprising a mixture of hydrogen ($H_2$) and argon (Ar) to form a tantalum doped ruthenium layer occur in separate process chambers.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Figure 5:
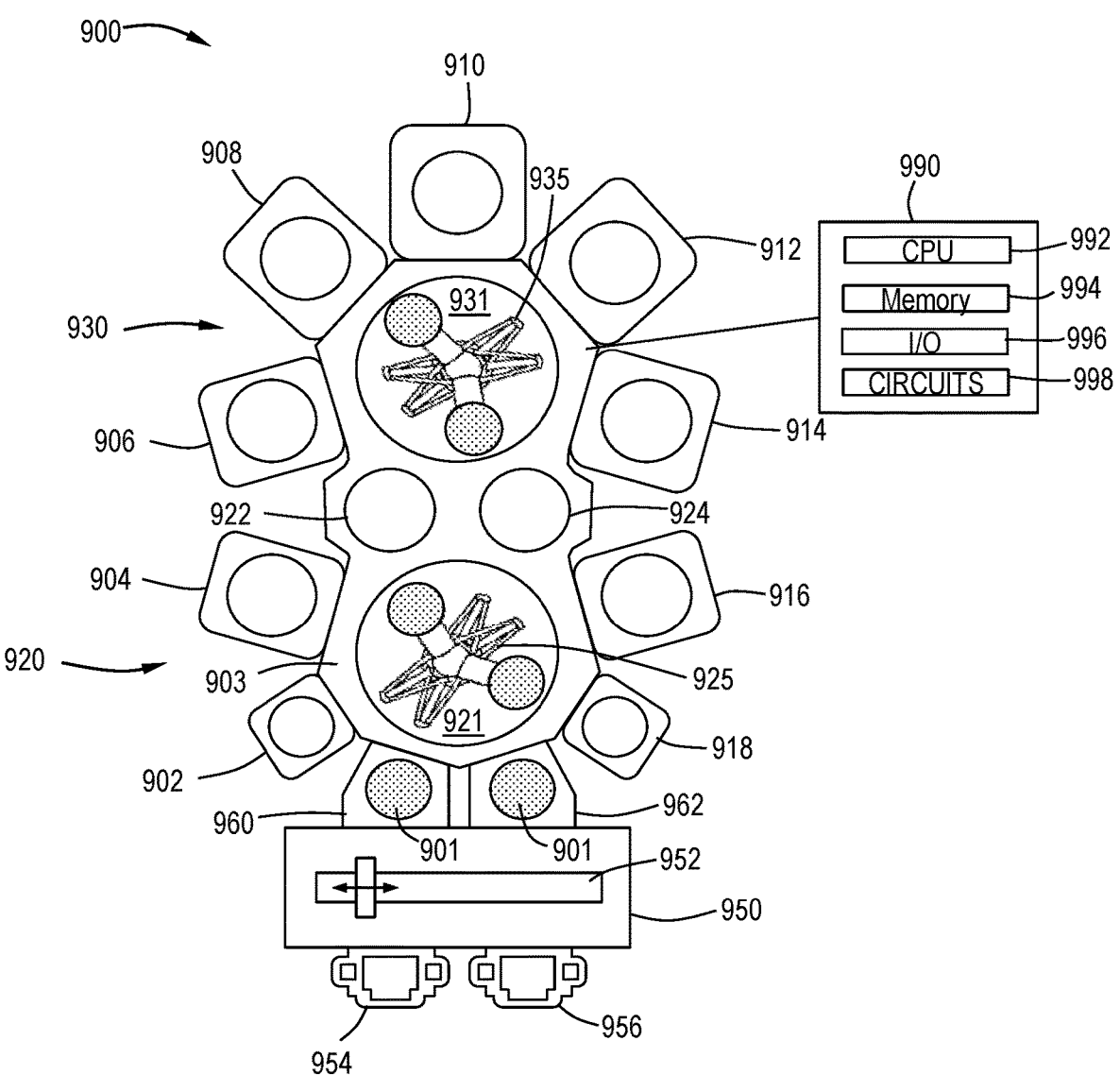
FIG. 5 illustrates a schematic diagram of a cluster tool according to one or more embodiment of the disclosure.

Additional embodiments of the disclosure are directed to processing tools for the formation of the memory devices and methods described, as shown in FIG. 5. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective etching chamber, and the like. The particular arrangement of process chambers and components can be varied depending on the cluster tool and should not be taken as limiting the scope of the disclosure.

In the embodiment shown in FIG. 5, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU), memory, suitable circuits and storage.

Accordingly, one or more embodiments of the disclosure are directed to cluster tools comprising one or more process chambers around a central transfer station. The one or more process chambers of some embodiments are configured to form a tantalum nitride layer on a substrate; form a ruthenium layer on the tantalum nitride layer; and expose the tantalum nitride layer and ruthenium layer to a plasma comprising a mixture of hydrogen ($H_2$) and argon (Ar) to form a tantalum doped ruthenium layer thereon. At least one controller is connected to the one or more process chambers and central transfer station. The at least one controller of some embodiments has one or more configurations selected from: a configuration to form a tantalum nitride layer on a substrate; a configuration to form a ruthenium layer on the tantalum nitride layer; a configuration to expose the tantalum nitride layer and ruthenium layer to a plasma comprising a mixture of hydrogen ($H_2$) and argon (Ar) to form a tantalum doped ruthenium layer thereon; and a configuration to move the substrate between the one or more process chambers and central transfer station.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Additional embodiments of the disclosure are directed to non-transitory computer readable medium including instructions, that, when executed by a controller of a processing chamber, causes the processing chamber to perform the operations of: depositing a tantalum nitride film on a substrate; depositing a ruthenium-containing film on the substrate; annealing the substrate; and exposing the substrate to a neon plasma.

One or more embodiments are directed to a non-transitory computer readable medium including instructions, that, when executed by a controller of a processing chamber, cause the processing chamber to: form a tantalum nitride layer on a substrate; form a ruthenium layer on the tantalum nitride layer; and expose the tantalum nitride layer and ruthenium layer to a plasma comprising a mixture of hydrogen ($H_2$) and argon (Ar) to form a tantalum doped ruthenium layer thereon.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an interconnect, the method comprising:

forming a tantalum nitride layer on a substrate;

forming a ruthenium layer on the tantalum nitride layer; and exposing the tantalum nitride layer and the ruthenium layer to a plasma comprising a mixture of hydrogen ($H_2$) and argon (Ar) to form a tantalum doped ruthenium layer.

2. The method of claim 1, wherein the tantalum doped ruthenium layer comprises in a range of from 3 at. % to 70 at. % tantalum.

3. The method of claim 1, wherein the tantalum doped ruthenium layer comprises greater than or equal to 60 at. % ruthenium.

4. The method of claim 1, wherein the tantalum nitride layer has a thickness in a range of from 1 Å to 5 Å, and the ruthenium layer has a thickness in a range of from 6 Å to 35 Å.

5. The method of claim 1, wherein each of the tantalum nitride layer and the ruthenium layer are independently formed by atomic layer deposition (ALD) or chemical vapor deposition (CVD).

6. The method of claim 5, wherein each of the tantalum nitride layer and the ruthenium layer are independently formed by atomic layer deposition (ALD) at a temperature in a range of form 200° C. to 300° C. and at a pressure in a range of from 0.5 Torr to 30 Torr.

7. The method of claim 1, wherein the tantalum doped ruthenium layer has a thickness of less than or equal to 25 Å.

8. The method of claim 7, wherein the thickness is less than or equal to 10 Å.

9. The method of claim 7, wherein the tantalum doped ruthenium layer has a copper (Cu) diffusion activation energy greater than a copper diffusion activation energy of a 20% ruthenium doped tantalum layer.

10. The method of claim 7, wherein the tantalum doped ruthenium layer has a copper (Cu) diffusion activation energy greater than 4.0 eV at a distance of 15 Å from a surface of the tantalum doped ruthenium layer.

11. The method of claim 1, further comprising a depositing a metal contact on the tantalum doped ruthenium layer.

12. The method of claim 11, wherein the metal contact comprises one or more of copper, cobalt, tungsten, or copper doped with one or more of manganese, tungsten or aluminum.

13. The method of claim 1, wherein the substrate has a surface with a structure formed therein, the structure extending a distance into the substrate and having sidewalls and a bottom, the bottom comprising a conductive material.

14. The method of claim 13, wherein the sidewalls of the structure comprise a low-k dielectric material.

15. The method of claim 14, wherein the tantalum doped ruthenium layer is a conformal film formed on the sidewalls and the bottom of the structure.

16. The method of claim 1, wherein the tantalum nitride layer and the ruthenium layer are part of a lamination of alternating tantalum nitride layers and ruthenium layers.

17. A method of forming an interconnect, the method comprising:

forming at least one conformal tantalum nitride layer and at least one ruthenium layer on a substrate having a surface with a structure formed therein, the structure extending a distance into the substrate and having sidewalls and a bottom, the bottom comprising a conductive material, the sidewalls comprising a low-k dielectric material comprising one or more of fluorine-doped silicon oxide, organosilicate glass or porous silicon dioxide, the at least one ruthenium layer formed on the at least one conformal tantalum nitride layer; and exposing the at least one conformal tantalum nitride layer and the at least one ruthenium layer to a plasma comprising a mixture of hydrogen ($H_2$) and argon (Ar) to form a tantalum doped ruthenium layer comprising greater than or equal to 80 at. % ruthenium.

18. The method of claim 17, wherein the tantalum doped ruthenium layer has a thickness less than or equal to 25 Å.

* * * * *